United States Patent
Lee et al.

(10) Patent No.: US 8,406,039 B2
(45) Date of Patent: Mar. 26, 2013

(54) LOW-LEAKAGE POWER SUPPLY ARCHITECTURE FOR AN SRAM ARRAY

(75) Inventors: Cheng Hung Lee, Hsin-Chu (TW); Hsu-Shun Chen, Miaoli County (TW); Wei Min Chan, Sindian (TW); Shao-Yu Chou, Chu-Pei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 314 days.

(21) Appl. No.: 12/775,220

(22) Filed: May 6, 2010

(65) Prior Publication Data

US 2011/0007596 A1 Jan. 13, 2011

Related U.S. Application Data

(60) Provisional application No. 61/225,112, filed on Jul. 13, 2009.

(51) Int. Cl.
*G11C 11/00* (2006.01)

(52) U.S. Cl. ............................ 365/154; 365/63; 365/226
(58) Field of Classification Search .................. 365/154, 365/226; 257/903
See application file for complete search history.

(56) References Cited

U.S. PATENT DOCUMENTS

| | | | | |
|---|---|---|---|---|
| 6,414,895 | B2* | 7/2002 | Kokubo et al. | 365/227 |
| 6,603,345 | B2* | 8/2003 | Takahashi | 327/534 |
| 2006/0002223 | A1* | 1/2006 | Song et al. | 365/226 |
| 2006/0076610 | A1* | 4/2006 | Osada et al. | 257/316 |

* cited by examiner

*Primary Examiner* — Hoai V Ho
(74) *Attorney, Agent, or Firm* — Slater & Matsil, L.L.P.

(57) ABSTRACT

A method of forming an integrated circuit structure includes providing a chip; forming a static random access memory (SRAM) cell including a transistor on the chip; and forming a bias transistor configured to gate a power supply voltage provided to the SRAM cell on the chip. The bias transistor and the transistor of the SRAM cell are formed simultaneously.

14 Claims, 6 Drawing Sheets

LOW-LEAKAGE POWER SUPPLY ARCHITECTURE FOR AN SRAM ARRAY

This application claims the benefit of U.S. Provisional Application No. 61/225,112 filed on Jul. 13, 2009, entitled "Low-Leakage Power Supply Architecture for an SRAM Array," which application is hereby incorporated herein by reference.

TECHNICAL FIELD

This invention relates generally to integrated circuits, and more particularly to power-supplying schemes and architecture for applying power to static random access memory (SRAM) arrays using gated power supplies.

BACKGROUND

In portable electronic devices, such as mobile communication devices, reducing power consumption is one of the key requirements in the respective integrated circuit design. One of the methods for reducing the power consumption is using dual operation mode, in which the normal operation of the integrated circuit may use a normal power supply voltage VDD that is high enough to drive the integrated circuit to achieve required high performance. In other operations not demanding high performance, a gated-VDD may be used to provide power to the integrated circuit. Under the gated-VDD that is lower than power supply voltage VDD, less power is consumed. The gated-VDD, although causing the degradation in the performance of the integrated circuit, is not an issue in certain operations, such as in the power down mode or standby mode.

FIG. 1 illustrates a conventional circuit capable of providing both power supply voltage VDD and a gated-VDD. Power supply line 10 carries power supply voltage VDD. Low-leakage mode control pin 14 is connected to the gate of PMOS transistor 18. Low-leakage mode control pin 14 determines whether SRAM array 12 should operate under power down/standby mode or normal operation mode. The voltage at low-leakage mode control pin 14 determines whether PMOS transistor 16 will be activated to reduce the power supply voltage provided to SRAM cell 12. The gate and the drain of PMOS transistor 16 are interconnected so that PMOS transistor 16 functions as a diode. Accordingly, PMOS transistor 16 is also referred to as a bias transistor.

A difficulty in the design and manufacturing of the circuit as shown in FIG. 1 is ensuring that PMOS transistor 16 has adequate voltage drop while at the same time providing adequate current to SRAM array 12. However, these two requirements often conflict with each other. Accordingly, a greater design margin is needed, which results in the increase in design and manufacturing costs, such as the increase in chip area usage.

SUMMARY OF THE INVENTION

In accordance with one aspect of the present invention, a method of forming an integrated circuit structure includes providing a chip; forming a static random access memory (SRAM) cell including a transistor on the chip; and forming a bias transistor configured to gate a power supply voltage provided to the SRAM cell on the chip. The bias transistor and the transistor of the SRAM cell are formed simultaneously.

In accordance with another aspect of the present invention, a method of forming an integrated circuit structure includes forming an SRAM array including forming an SRAM cell, wherein the step of forming the SRAM cell further includes forming a transistor; forming a power supply line configured to carry a power supply voltage; and forming a bias transistor electrically coupled between the power supply line and the SRAM array. The bias transistor is configured to gate the power supply voltage. The step of forming the SRAM cell and the step of forming the bias transistor include simultaneously forming a first pocket region of the bias transistor and a second pocket region of the transistor of the SRAM cell; simultaneously forming a first source/drain extension region of the bias transistor and a second source/drain extension region of the transistor of the SRAM cell; and simultaneously forming a first deep source/drain region of the bias transistor and a second deep source/drain region of the transistor of the SRAM cell.

In accordance with yet another aspect of the present invention, an integrated circuit includes a power supply line; an SRAM array including an SRAM cell with the SRAM cell including a transistor; an edge cell region encircling the SRAM array, referred to alternatively throughout this specification as SRAM cell array; and a bias transistor connected as a diode and electrically coupled between the power supply line and the SRAM cell array. The bias transistor is configured to gate a power supply voltage on the power supply line and provide a gated power supply voltage to the SRAM array. The bias transistor is in the edge cell region.

Features of the present invention include synchronized manufacturing processes of the bias transistors and SRAM arrays so that design variations can be reduced and an increase in the efficiency of chip area usage.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention and do not limit the scope of the invention.

A novel method for manufacturing power supply circuits capable of providing a gated power supply voltage (a gated-VDD or a gated-VSS) is provided. The gated-VDD is a positive voltage reduced from positive power supply voltage VDD, and the gated VSS is a voltage raised from power supply voltage VSS, which may be at 0V. The respective circuit structure is also provided. The variations and the operation of the embodiment are discussed. Throughout the various views and illustrative embodiments of the present invention, like reference numbers are used to designate like elements.

Figure 1:
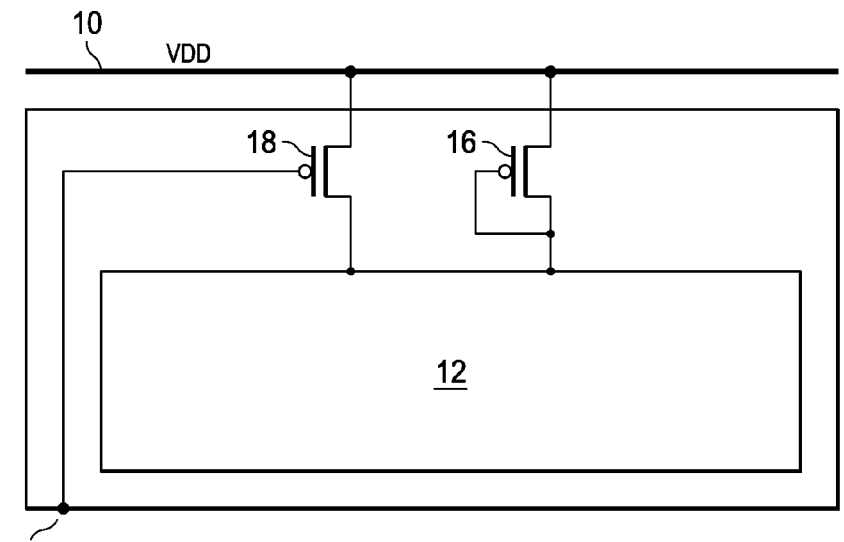
FIG. 1 illustrates a conventional power supply architecture for providing power to a static random access memory (SRAM) array.
Figure 2:
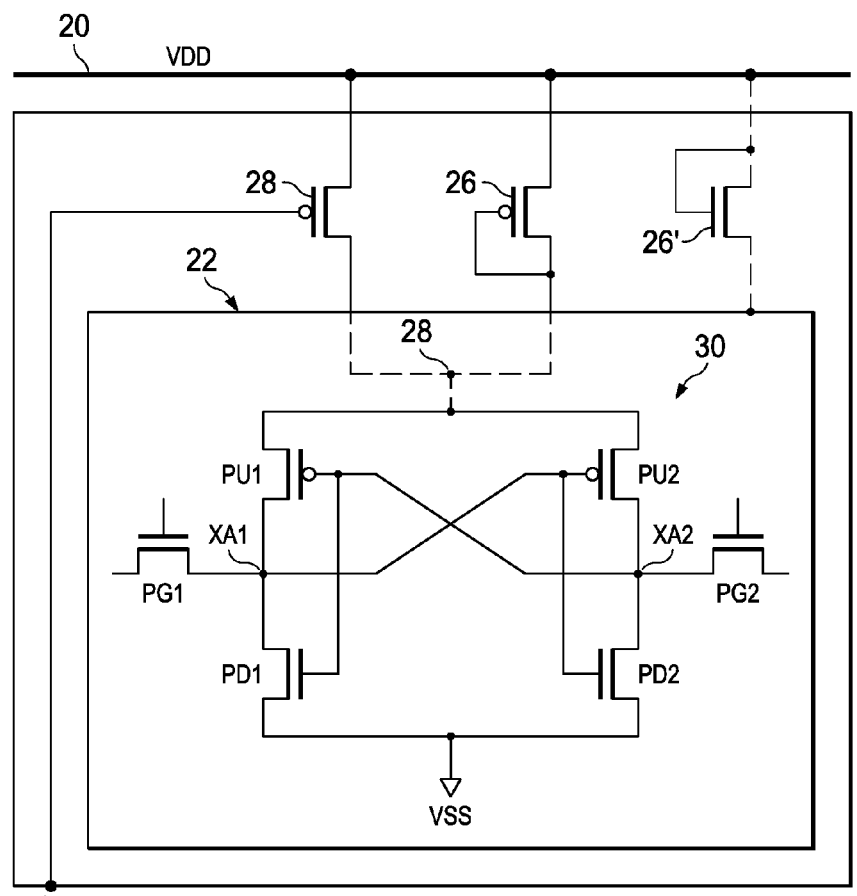
FIG. 2 illustrates a power supply architecture in accordance with an embodiment.

FIG. 2 illustrates a schematic circuit diagram in accordance with an embodiment of the present invention. Power supply line 20 supplies positive power supply voltage VDD to static random access memory (SRAM) array 22. Low-leakage mode control pin 24 is connected to the gate of PMOS transistor 28. Low-leakage mode control pin 24 may be used by external circuits to control whether SRAM array 22 should operate under a power down/standby mode or a normal operation mode. If a logic low voltage, such as voltage VSS, is provided to the gate of PMOS transistor 28, PMOS transistor 28 is turned on and power supply voltage VDD is provided to SRAM array 22 directly. If, however, a logic high voltage, such as voltage VDD, is provided to the gate of PMOS transistor 28, PMOS transistor 28 is turned off and the gated-VDD, which equals voltage VDD minus the voltage drop on bias transistor 26, is supplied to SRAM array 22. The gate and the drain of PMOS transistor 26 are interconnected to function as a diode. Accordingly, PMOS transistor 26 is also referred to as bias transistor 26. In alternative embodiments, a bias transistor formed of an NMOS transistor 26' (whose connection is shown with dotted lines) may be used to replace PMOS transistor 26.

The drains of PMOS transistors 26 and 28 are interconnected to a common node 28. Accordingly, node 28 may either carry power supply voltage VDD or gated-VDD. SRAM array 22 includes a plurality of SRAM cells arranged as columns and rows (not shown). An exemplary SRAM cell 30 in SRAM array 22 is illustrated. It is noted that SRAM cells in SRAM array 22 may have many variations, including, but not limited to, six-transistor SRAM cells, eight-transistor SRAM cells, single-port SRAM cells, dual-port SRAM cells, and the like, and these variations are within the scope of the embodiments of the present invention.

SRAM cell 30 includes pull-up transistors PU1 and PU2 and pull-down transistors PD1 and PD2. Pull-up transistors PU1 and PU2 and pull-down transistors PD1 and PD2 may be coupled between node 28 and voltage VSS. Storage nodes XA1 and XA2, which are the connecting point of the drain regions of pull-up transistors PU1 and PU2 to the respective pull-down transistors PD1 and PD2, are coupled to bit-lines (not shown) through pass-gate transistors PG1 and PG2, respectively. The gates of pass-gate transistors PG1 and PG2 are connected to word-lines (not shown).

Figure 3A:
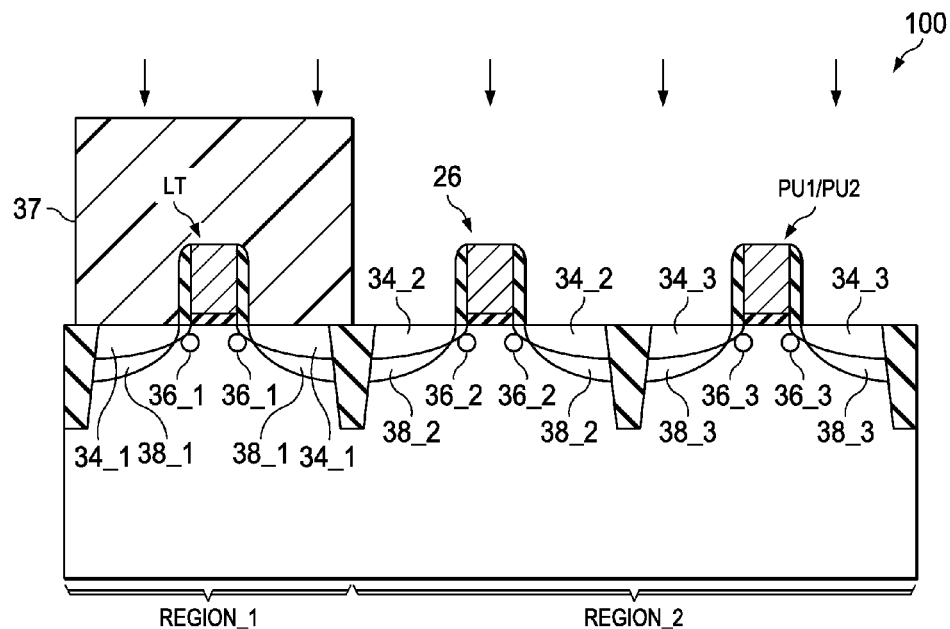
FIGS. 3A and 3B illustrate cross-sectional views in an intermediate stage in the manufacturing of the structure shown in FIG. 2.
Figure 3B:
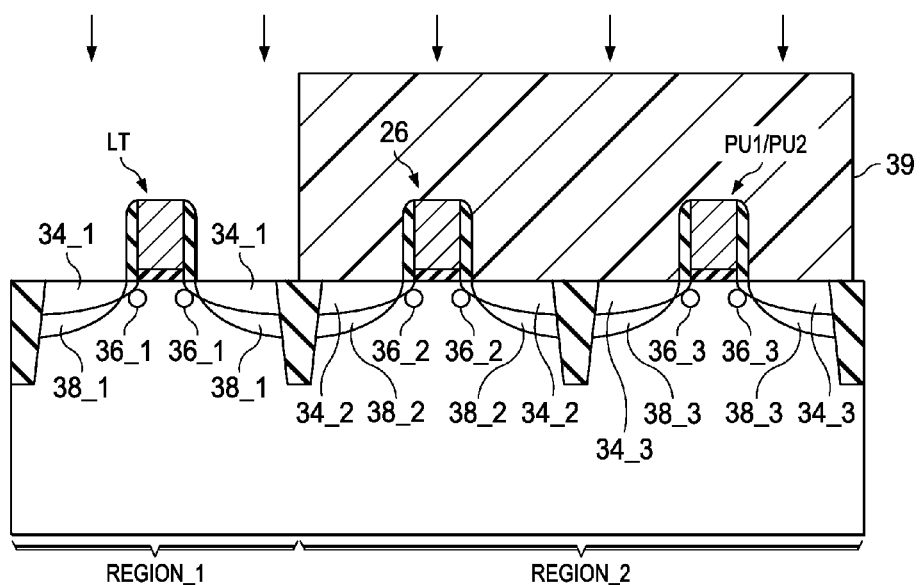

In an embodiment, bias transistor 26 is formed simultaneously with the formation of pull-up transistor PU1 and PU2 (and possibly all other pull up transistors and/or other PMOS transistors in SRAM array 22). FIGS. 3A and 3B illustrate cross-sectional views of intermediate stages in the formation of the structure as shown in FIG. 2, which is a portion of chip 100. FIGS. 3A and 3B also illustrate (p-type) logic transistor LT and corresponding source/drain extension (SDE) regions 34_1, pocket regions 36_1, and deep source/drain regions 38_1, bias transistor 26 and corresponding source/drain extension (SDE) regions 34_2, pocket regions 36_2, and deep source/drain regions 38_2, and pull-up transistors PU1/PU2 and corresponding source/drain extension (SDE) regions 34_3, pocket regions 36_3, and deep source/drain regions 38_3. Logic transistor LT may be in logic circuit 42 (not shown in FIGS. 3A and 3B, please refer to FIG. 5), which is outside of any memory array/device. Logic circuit 42 may be a control circuit of an SRAM array, or the like. Please note that FIGS. 3A and 3B only illustrate the steps for forming deep source/drain regions. One skilled in the art will be able to realize the photo resist patterns and the lithography mask patterns for forming the pockets and source/drain extension regions, which may be the same as that for forming deep source/drain regions.

Figure 4A:
FIGS. 4A and 4B illustrate portions of lithography masks that may be used in the process steps shown in FIGS. 3A and 3B.

In an exemplary embodiment, SDE regions 34_2 and 34_3 are formed simultaneously using a same lithography mask (refer to FIG. 4A). Accordingly, SDE regions 34_2 and 34_3 (both are drawn in a continuous region marked as Region_2, although they may be in physically separated regions) are implanted with the same impurity element, same dosage, and have the same doping concentration. SDE regions 34_1 (in a region marked as Region_1), on the other hand, are formed using a different lithography mask (refer to FIG. 4B) than the lithography mask for forming SDE regions 34_2 and 34_3 (in a region marked as Region_1). Also, SDE regions 34_2 and 34_3 are formed at a different time than the formation of SDE regions 34_1.

Similarly, pocket regions 36_2 and 36_3 may be formed simultaneously using a same lithography mask (refer to FIG. 4A), and deep source/drain regions 38_2 and 38_3 may be formed simultaneously using a same lithography mask, which may also be the same mask used for forming pocket regions 36_2 and 36_3. Accordingly, pocket regions 36_2 and 36_3 are implanted with the same impurity element, the same dosage, and have the same doping concentration, and deep source/drain regions 38_2 and 38_3 are implanted with the same dosage, and have the same doping concentration. Pocket regions 36_1, on the other hand, are formed using a different lithography mask (refer to FIG. 4B) than the photo mask for forming pocket regions 36_2 and 36_3 and deep source/drain regions 38_2 and 38_3. Accordingly, pocket regions 36_1 may have a different doping concentration than that of pocket regions 36_2 and 36_3, and deep source/drain regions 38_1 may have a different doping concentration than that of deep source/drain regions 38_2 and 38_3.

Figure 4B:

FIGS. 4A and 4B illustrate exemplary lithography masks, which have transparent patterns for allowing light to pass and opaque patterns for blocking the light. Regions Region_1 and Region_2 in FIGS. 4A and 4B correspond to the same regions in FIGS. 3A and 3B. The lithography masks may be used for defining photo resist patterns (for example, photo resist 37 in FIG. 3A and photo resist 39 in FIG. 3B) that are used in the formation of the SDE regions, pocket regions, and deep source/drain regions as shown in FIGS. 3A and 3B. It is realized that there exist positive photo resists and negative photo resists, and hence the patterns (corresponding to regions Region_1 and Region_2) in FIGS. 4A and 4B may be inversed if an opposite type of photo resist is used. It is observed that that the portions of the lithograph masks corresponding to bias transistor 26 and pull-up transistors PU1/PU2 have a same pattern (either transparent or opaque), while the portion corresponding to logic transistor LT has a reversed pattern.

It is realized that conventionally the design of SRAM array 22 and other SRAM arrays on the same chip are often made before the design of logic circuits and the circuits related to the power supply (including bias transistor 26). Therefore, conventionally, the formation of bias transistor 26 is made simultaneously with the formation of logic transistors such as transistor LT as shown in FIGS. 3A and 3B. Such a scheme was also beneficial for reducing manufacturing cost since the design and formation of the bias transistor does not require the modification of the design (such as the lithography mask pattern) of the existing design of the SRAM arrays. However, in embodiments of the present invention, bias transistor 26 is formed simultaneously with the formation of SRAM transistors, and hence may require the modification of the design of the existing SRAM arrays, resulting in increased design costs. To solve this problem, in an embodiment of the present invention, bias transistor 26 is formed in the edge cell regions of SRAM cell arrays.

Figure 5:
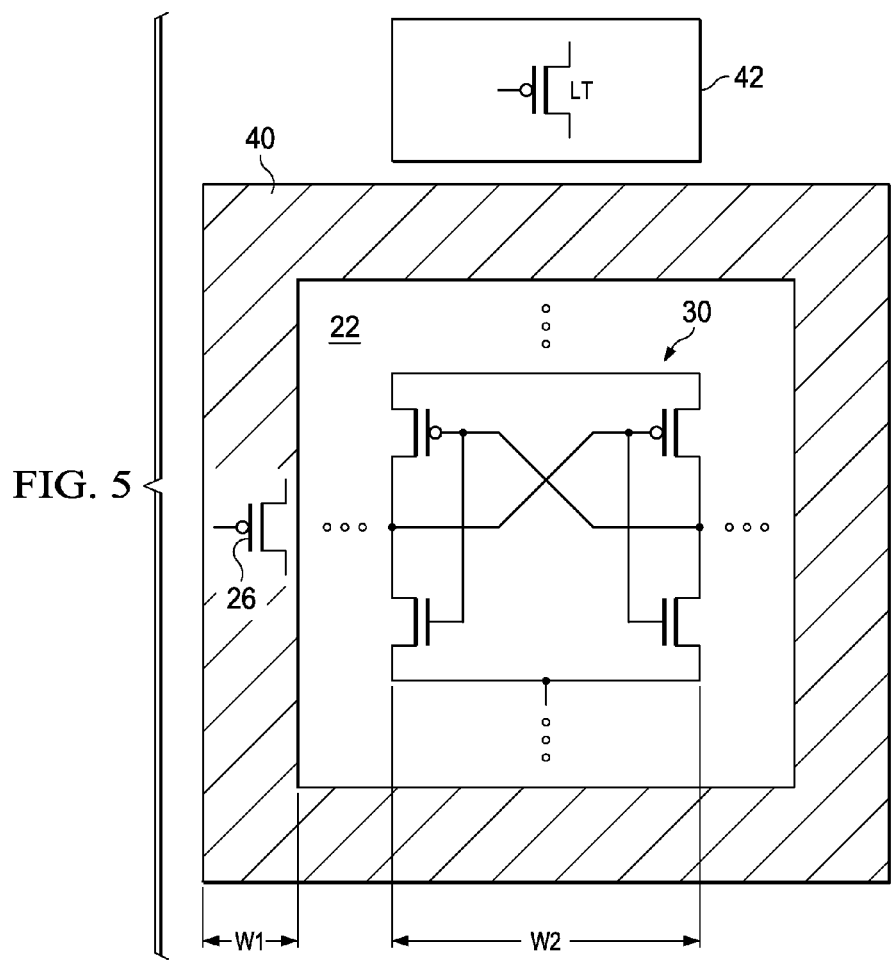
FIGS. 5 and 6 illustrate cell edge region(s) and bias transistors formed in the cell edge region(s)
Figure 6:
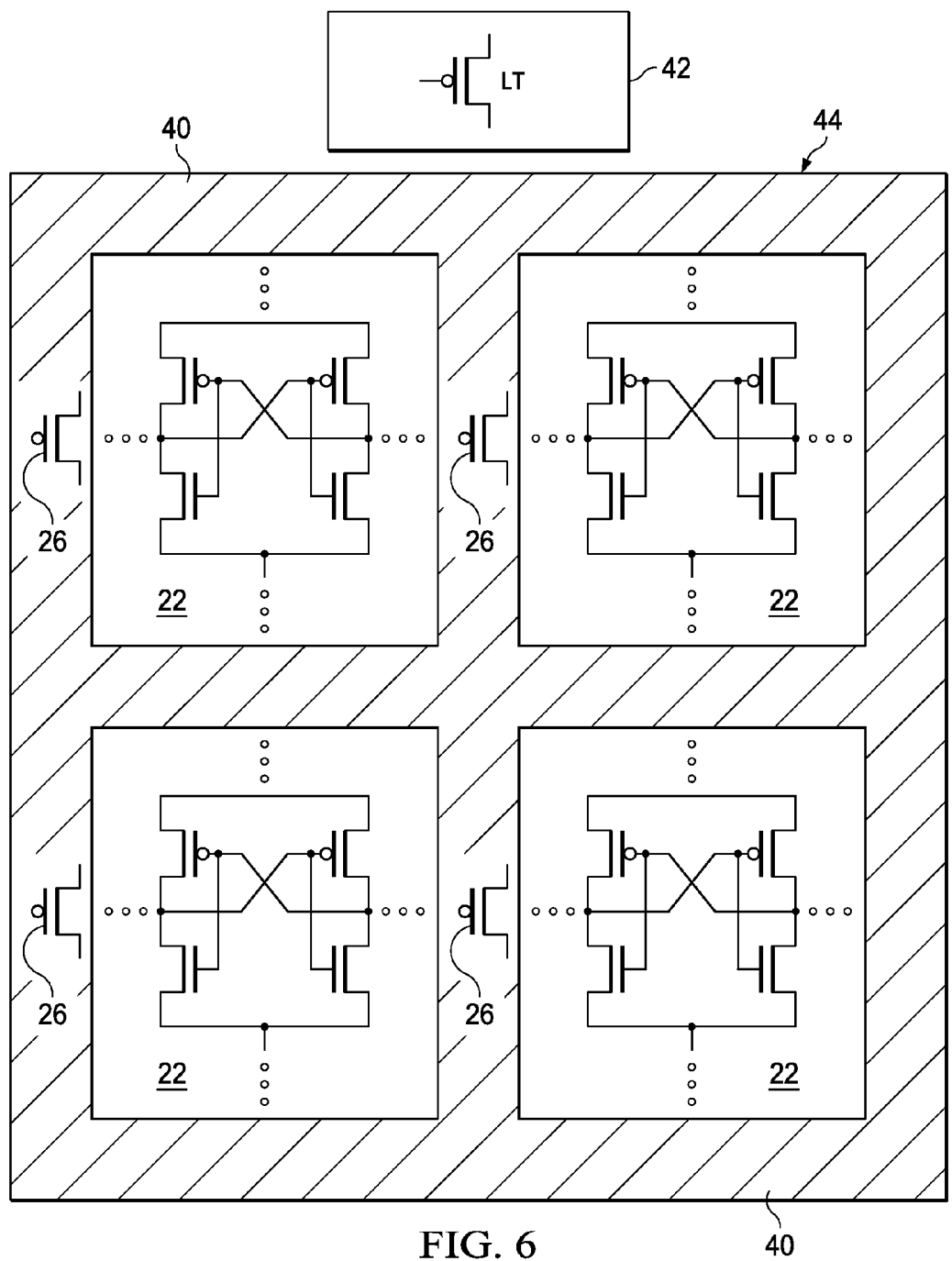

Referring to FIG. 5, SRAM cell array 22, which may occupy a rectangular shape of the chip area, may be surrounded by edge cell region 40. Logic circuit 42 (which may include logic transistor LT) is formed outside edge cell region 40. In a memory macro comprising one or more SRAM cell arrays as shown in FIG. 6, edge cell regions 40 are used to surround each of the SRAM cell arrays and to space SRAM cell arrays apart from each other. Conventionally, edge cell region 40 is empty with no transistors formed therein. In some embodiments, edge cell region 40 comprises an active/shallow trench isolation region. In an embodiment of the present invention, one or more bias transistor 26 is formed in edge cell region 40, instead of outside of the SRAM macros and in any logic circuit, such as circuit 42, in which logic transistor LT is located. An advantageous feature for forming bias transistor 26 in edge cell region 40 is that the design of bias transistor 26 and SRAM array 22 are now in a continuous region. Hence, the manufacturing of bias transistor 26 may be performed simultaneously with transistors in SRAM cells. The manufacturing of bias transistor 26 may be made before the design of logic circuits. Accordingly, the design of SRAM arrays and the corresponding bias transistors acts as an integrated unit that may be ported between different applications/chips without being modified.

In an embodiment, width W1 of edge cell region 40 may be between about 50 percent and about twice the width W2 of SRAM cell 30. An exemplary width W1 of edge cell region 40 may be between about 0.5 μm and about 2 μm. Edge cell region 40 may be substantially free from additional integrated circuit devices such as transistors.

FIG. 6 illustrates a plurality of SRAM arrays in SRAM macro 44, wherein edge cell regions 40 space SRAM arrays 22 apart from each other. Each of SRAM arrays 22 may need one or more bias transistor 26 for supplying its power. Accordingly, SRAM macro 44 may be pre-designed as an integrated unit before the design of logic circuit 42, which is outside SRAM macro 44. Again, it is observed that forming bias transistors 26 simultaneously with SRAM transistors instead of logic transistor LT may result in the reduction of manufacturing costs.

Figure 7:
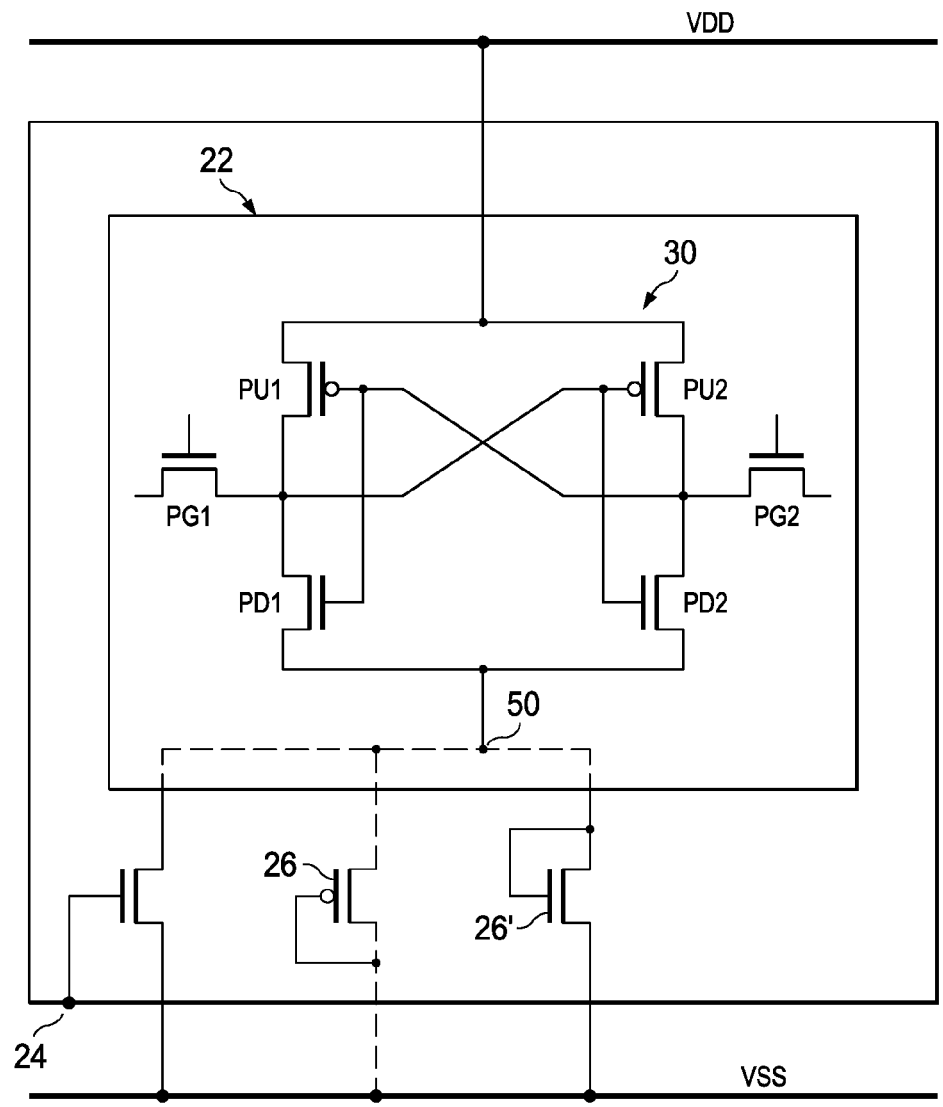
FIG. 7 illustrates a power supply architecture for providing a gated-VSS to an SRAM array in accordance with an embodiment.

FIG. 7 illustrates an additional embodiment, wherein, instead of power supply voltage VDD, power supply voltage VSS is gated (raised) by bias transistor 26'. The gated-VSS is higher than normal voltage VSS, for example, by between about 30 percent and about 40 percent of (VDD-VSS). In normal operation mode, SRAM array 22 may be supplied with power supply voltages VDD and VSS. In power down mode or standby mode, the voltage at node 50 is increased to the gated-VSS, and hence the voltage difference (VDD-gated-VSS) is applied onto SRAM array 22. The power consumption is thus reduced. In an embodiment, bias transistor 26' is an NMOS transistor. In alternative embodiments, a bias transistor formed of a PMOS transistor 26 (whose connection is shown with dotted lines) may be used to replace NMOS transistor 26'.

Figure 8:
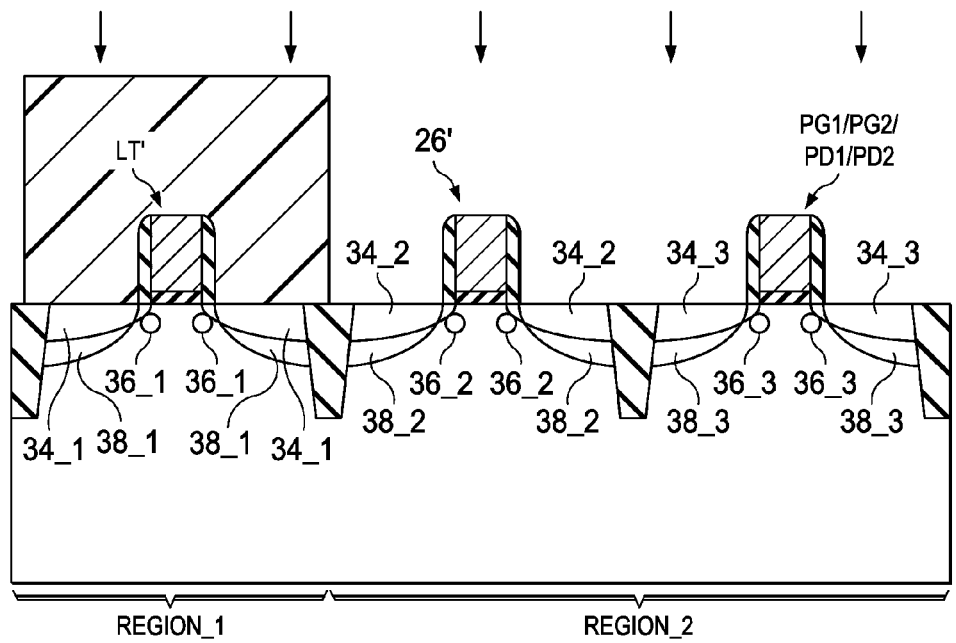
FIG. 8 illustrates a cross-sectional view in an intermediate stage in the manufacturing of the structure shown in FIG. 7.

FIG. 8 illustrates a cross-sectional view of an intermediate stage in the formation process of bias transistor 26' and NMOS transistors of SRAM cell 30 in FIG. 7. This embodiment is similar to the embodiment shown in FIGS. 3A and 3B, except now bias transistor 26' is simultaneously formed with the formation of pull-down transistors PD1/PD2 and/or pass-gate transistors PG1/PG2. The components, such as pocket regions, source/drain extension regions, and deep source drains of bias transistor 26', will thus be the same as the respective components of pull-down transistors PD1/PD2 and/or pass-gate transistor PG1/PG2. Again, bias transistor 26' and NMOS transistors of SRAM cell 30 are not formed simultaneously with the formation of any NMOS transistor LT' in any of the logic circuits on the same chip, such as logic circuit 42 (not shown in FIG. 8, please refer to FIGS. 5 and 6).

The embodiments of the present invention may provide several advantageous features. By forming bias transistors simultaneously with the formation of transistors in SRAM cells, bias transistors and the transistors in SRAM cells will have similar process variations, temperature variations, and/or voltage variations, and hence the design margin may be reduced. For example, conventionally, since bias transistors and SRAM cell transistors are not formed simultaneously, they may work at different process corners. If the bias transistors work at the slow-slow (SS) corner while the SRAM cell transistors work at the fast-fast (FF) corner, the bias transistors may not be able to provide the high current required by the high-leakage SRAM cell transistors. Conversely, if the bias transistors work at the FF corner while the SRAM cell transistors work at the SS corner, the bias transistors may not be able to have adequate voltage drop to achieve enough power saving. Therefore, conventionally, a greater design margin is needed to ensure design specifications are met in all process corners. In the embodiments of the present invention, by forming bias transistors and SRAM cell transistors simultaneously, they will always work at the same process corner.

Figure 9:
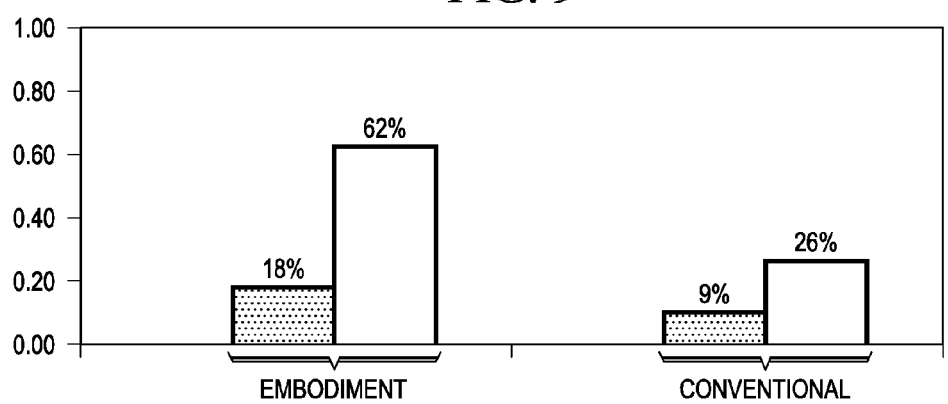
FIG. 9 shows results comparing the leakage reduction ratios of different power supply architectures.

FIG. 9 illustrates experiment results. In the results, the leakage reductions are compared to the leakages of SRAM cells having no bias transistors. It is noted that in conventional circuits adopting the bias transistors with bias transistors formed simultaneously with logic transistors, the leakage power reduction is reduced by about 26 percent if the SRAM array works at the FF corner, with power supply voltage VDD being 1.1V, and a working temperature equal to 125° C. The embodiments of the present invention, however, may have a leakage reduction up to 62 percent compared to circuits not having the bias transistors. If the working condition is changed to a typical-typical (TT) corner, 1.1V, and 25° C., the conventional circuit may have a leakage reduction of about 9 percent, while the leakage reduction of the embodiments of the present invention is increased to 18 percent. These results reveal that the embodiments of the present invention may have better leakage-reduction effects.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method of forming an integrated circuit structure, the method comprising:
    providing a chip;
    forming a static random access memory (SRAM) cell comprising a transistor on the chip; and
    forming a bias transistor configured to gate a power supply voltage provided to the SRAM cell on the chip, wherein the bias transistor and the transistor of the SRAM cell are formed simultaneously, and wherein the step of forming the bias transistor and the step of forming the transistor of the SRAM cell comprise:
        simultaneously forming a first pocket region of the bias transistor and a second pocket region of the transistor of the SRAM cell.

2. The method of claim 1, wherein the integrated circuit structure further comprises a power supply line and an SRAM array comprising the SRAM cell, wherein a gate and a drain of the bias transistor are interconnected to form a diode, and wherein the diode is coupled between the power supply line and the SRAM array.

3. The method of claim 1, wherein the bias transistor is a PMOS transistor, and wherein the transistor of the SRAM cell is a pull-up transistor.

4. The method of claim 1, wherein the bias transistor is an NMOS transistor, and wherein the transistor of the SRAM cell is selected from the group consisting essentially of a pull-down transistor, a pass-gate transistor, and combinations thereof.

5. The method of claim 1, wherein the step of forming the bias transistor and the step of forming the transistor of the SRAM cell comprise:
    simultaneously forming a first source/drain extension region of the bias transistor and a second source/drain extension region of the transistor of the SRAM cell; and
    simultaneously forming a first deep source/drain region of the bias transistor and a second deep source/drain region of the transistor of the SRAM cell.

6. The method of claim 1, wherein the transistor of the SRAM cell is formed in an edge cell region of an SRAM array, wherein the SRAM array comprises the SRAM cell, and wherein the edge cell region encircles the SRAM array.

7. The method of claim 6, wherein substantially no additional transistors are formed in the edge cell region in addition to the bias transistor.

8. The method of claim 6, wherein the edge cell region is an active/shallow trench isolation region.

9. A method of forming an integrated circuit structure, the method comprising:
    forming a static random access memory (SRAM) array including forming an SRAM cell, wherein the step of forming the SRAM cell further comprises forming a transistor;
    forming a power supply line configured to carry a power supply voltage; and
    forming a bias transistor electrically coupled between the power supply line and the SRAM array, wherein the bias transistor is configured to gate the power supply voltage, and wherein the step of forming the SRAM cell and the step of forming the bias transistor comprise:
        simultaneously forming a first pocket region of the bias transistor and a second pocket region of the transistor of the SRAM cell;
        simultaneously forming a first source/drain extension region of the bias transistor and a second source/drain extension region of the transistor of the SRAM cell; and
        simultaneously forming a first deep source/drain region of the bias transistor and a second deep source/drain region of the transistor of the SRAM cell.

10. The method of claim 9 further comprising forming a logic circuit comprising a logic transistor on a same chip and of a same type as the transistor of the SRAM cell and the bias transistor, wherein the step of forming the transistor of the SRAM cell is performed at a different time than the step of forming the logic transistor.

11. The method of claim 9, wherein a diode is coupled between a power supply line and the SRAM array.

12. The method of claim 11, wherein the bias transistor is a PMOS transistor, and wherein the transistor of the SRAM cell is a pull-up transistor.

13. The method of claim 11, wherein the bias transistor is an NMOS transistor, and wherein the transistor of the SRAM cell is selected from the group consisting essentially of a pull-down transistor, a pass-gate transistor, and combinations thereof.

14. The method of claim 9, wherein the transistor of the SRAM cell is formed in an edge cell region of an SRAM array comprising the SRAM cell, and wherein the edge cell region encircles the SRAM array with substantially no additional transistors formed therein in addition to the bias transistor, and wherein the edge cell region is an active/shallow trench isolation region.

* * * * *